(12) United States Patent
Cunningham et al.

(10) Patent No.: US 7,692,423 B2
(45) Date of Patent: Apr. 6, 2010

(54) SELF NAVIGATING CARTESIAN TRAJECTORY

(75) Inventors: Charles H. Cunningham, San Francisco, CA (US); Michael Lustig, Stanford, CA (US); John M. Pauly, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 7 days.

(21) Appl. No.: 11/868,617

(22) Filed: Oct. 8, 2007

(65) Prior Publication Data
US 2009/0091321 A1 Apr. 9, 2009

(51) Int. Cl.
*G01V 3/00* (2006.01)
(52) U.S. Cl. .................................................. 324/307
(58) Field of Classification Search ......... 324/300–322; 600/410–435
See application file for complete search history.

(56) References Cited

U.S. PATENT DOCUMENTS

| | | | | |
|---|---|---|---|---|
| 4,987,371 A | * | 1/1991 | Glover et al. | 324/320 |
| 5,285,158 A | * | 2/1994 | Mistretta et al. | 324/309 |
| 5,952,827 A | * | 9/1999 | Feinberg | 324/309 |
| 6,198,959 B1 | * | 3/2001 | Wang | 600/413 |
| 6,230,039 B1 | * | 5/2001 | Stuber et al. | 600/410 |
| 6,404,196 B1 | | 6/2002 | Duerk et al. | |
| 6,647,134 B1 | * | 11/2003 | McGee et al. | 382/128 |
| 7,047,062 B2 | * | 5/2006 | Licato et al. | 600/410 |
| 7,245,124 B2 | * | 7/2007 | Shu et al. | 324/307 |

OTHER PUBLICATIONS

Lustig et al., "Butterfly: A Self Navigating Cartesian Trajectory", Poster presented at ISMRM 2007, 1 page.

* cited by examiner

*Primary Examiner*—Brij B Shrivastav
*Assistant Examiner*—Dixomara Vargas
(74) *Attorney, Agent, or Firm*—Beyer Law Group LLP

(57) ABSTRACT

A method for magnetic resonance imaging (MRI) is provided. A magnetic resonance excitation is provided. A magnetic field is read out through k-space using winders, wherein some of the winders overlap for a length of the winders. Readout data from overlapping lengths of winders is used to estimate motion. The readout may use a two dimensional discrete Fourier transform acquisition.

19 Claims, 8 Drawing Sheets

SELF NAVIGATING CARTESIAN TRAJECTORY

STATEMENT REGARDING FEDERALLY SPONSORED RESEARCH OR DEVELOPMENT

The U.S. Government has rights in the disclosed invention pursuant to NIH Grant No. NIH-R01HL074332, NIH-R01HL067161 to Stanford University.

BACKGROUND OF THE INVENTION

This invention relates generally to magnetic resonance imaging (MRI), and more particularly, the invention relates to mapping the magnitude of RF fields in a MRI pulse sequence.

Magnetic resonance imaging (MRI) requires placing an object to be imaged in a static magnetic field ($B_0$), exciting nuclear spins in the object with a RF magnetic field ($B_1$), and then detecting signals emitted by the excited spins as they precess within the magnetic field ($B_0$). Through the use of magnetic gradient and phase encoding of the excited magnetization, detected signals can be spatially localized in three dimensions.

SUMMARY

In accordance with the invention a method for magnetic resonance imaging (MRI) is provided. A magnetic resonance excitation is provided. A magnetic field is read out through k-space using winders, wherein some of the winders overlap for a length of the winders. Readout data from overlapping lengths of winders is used to estimate motion.

In another manifestation of the invention a method for magnetic resonance imaging (MRI) is provided. A magnetic resonance excitation is applied. A magnetic field is read out through k-space using winders with a two dimensional discrete Fourier transform (2DFT), wherein some of the winders have a common initial trajectory for a length of the winders. The readout data only from the common initial trajectory of winders is used to estimate motion.

In another manifestation of the invention a magnetic resonance imaging apparatus is provided. A magnetic resonance imaging excitation and detection system is provided. A controller is electrically connected to the magnetic resonance imaging excitation and detection system and comprises a display, at least one processor, and computer readable media. The computer readable media comprises computer readable code for applying a magnetic resonance excitation, computer readable code for reading out a magnetic field through k-space using winders, wherein some of the winders overlap for a length of the winders, and computer readable code for using readout data from overlapping lengths of winders to estimate motion.

The invention and objects and features thereof will be more readily apparent from the following detailed description and appended claims when taken with the drawings.

DETAILED DESCRIPTION OF ILLUSTRATIVE EMBODIMENTS

Patient motion during scanning often causes image artifacts. Many motion artifact reduction techniques require additional scan time or complexity or specialized scan trajectories. Others are able to only detect the motion but not estimate it. In an example of the invention a new self-navigating technique for Cartesian acquisitions is provided. The method has the following properties:

1. It can detect any type of motion that occurs during the scan with a time sampling resolution of a single TR.
2. It can measure and correct translational motion at sub-pixel accuracy with a time sampling resolution of a single TR.
3. It has negligible scan time penalty compared to traditional Cartesian scans, as the navigation information is obtained during the prewinding (and potentially the rewinding) of the phase encodes.
4. The implementation of the scheme is simple and requires only minor modification of existing pulse sequences.
5. The acquisition is Cartesian, and is interchangeable with 99% of current clinical pulse sequences.

The method has many potential applications. It can be used to correct motion in scans when the motion is primarily translational, e.g. for imaging the shoulder or knee. It can be used for extremely high resolution scans with long duration, e.g. neuro applications or microscopy, in which the motion is well approximated as translations. The method can be used to get motion information in real time for correction or alternatively for acceptation/rejection of the data, e.g. for cardiac and abdominal imaging. A simple and important application would be to display the motion that occurs during a scan to alert the MR technician that the scan should be aborted and repeated thus saving precious scanner time. In general, it can be used as a replacement for current spin-warp product pulse sequences, providing motion information and correction when needed without requiring any time overhead.

1 TECHNICAL DESCRIPTION

Simple rigid body translation motion causes a linear phase in k-space. More complicated forms of motion such as rotations and non-rigid motion affect the magnitude as well as the phase. In imaging, a navigator echo is used to detect or estimate the motion. For example, when the same k-space trajectory is acquired over and over, changes in the magnitude and phase indicate that motion has occurred. In particular, when the motion is pure rigid translation, the translation can be measured by estimating the linear phase component.

1.1 PULSE SEQUENCE

Using the Prewinders as Navigators

Figure 1:
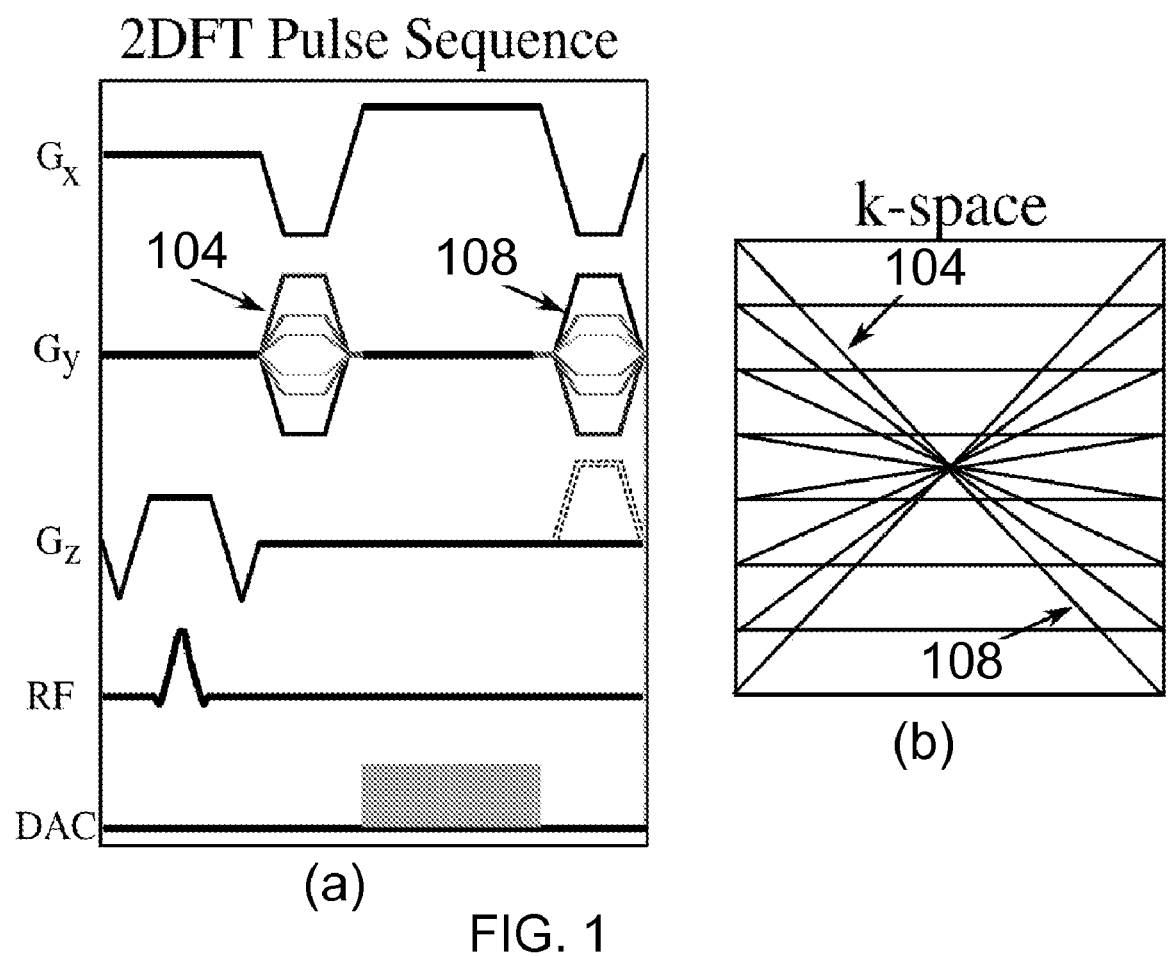
FIGS. 1a-b illustrate a two dimensional spin-warp sequence, used in the prior art.

FIGS. 1a-b illustrate a two dimensional Fourier transform spin-warp sequence (2DFT), used in the prior art. Gradient prewinders 104 are used to traverse from the center of k-space to the start of the particular k-space line to be acquired. The k-space trajectories of the prewinders are different radial straight lines and therefore are not suitable for navigation. Gradient rewinders 108 are used to traverse from the end of a particular k-space line to be acquired to center of k-space. The k-space trajectories of the rewinders are different radial straight lines, where none of the length of the prewinders 104 and rewinders overlap, but only intersect at a single point, and therefore are not suitable for navigation.

Figure 2:
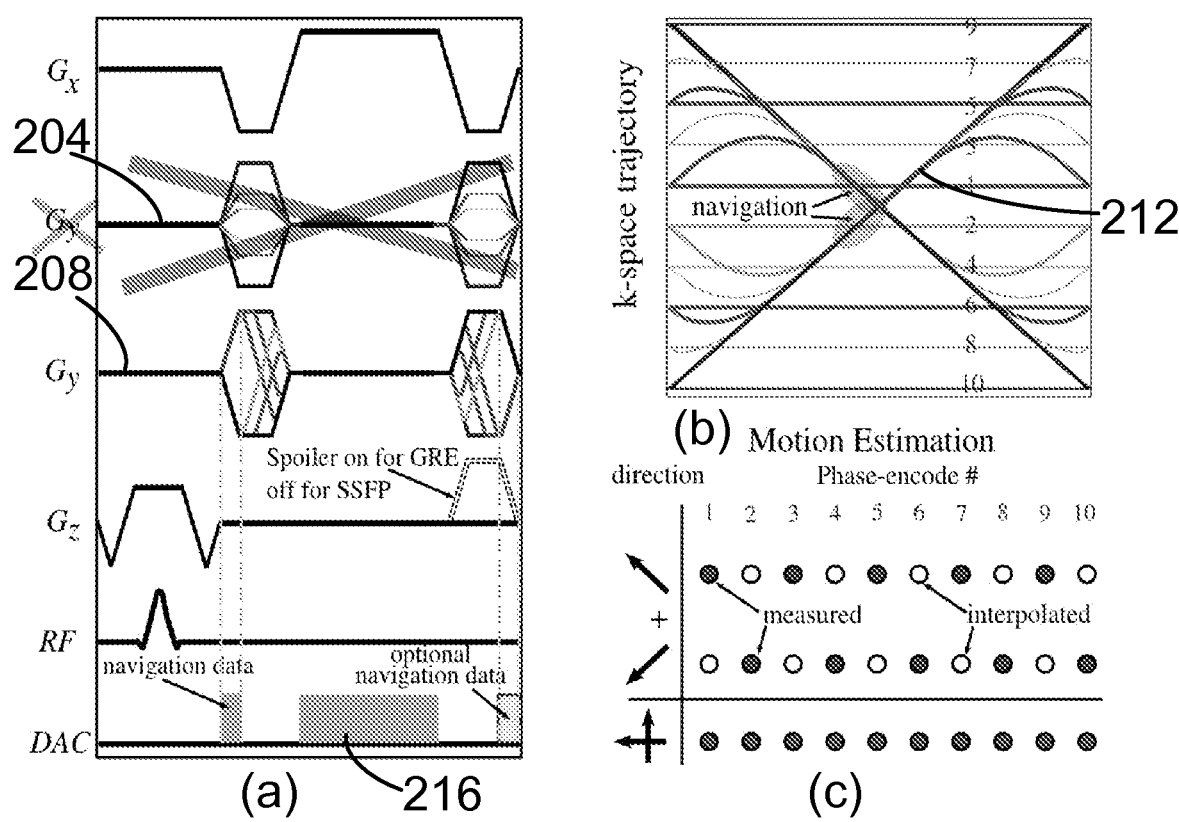
FIGS. 2a-c illustrate a modified pulse sequence for 2DFT.

Instead, in this example of the invention, the phase encode gradients are made to retrace the same diagonal radial trajectory in k-space every TR. The diagonal trajectory is followed until the point in which the desired gradient area is still achievable without increasing the prewinder's duration. FIGS. 2a-c illustrate a modified pulse sequence for 2DFT. The modified pulsed sequence in this example is a Butterfly pulse-sequence. The traditional phase encode gradients of the 2DFT pulse sequence 204 are replaced by gradients 208 that enable navigation. The duration of the waveforms is not changed. The modified phase encode gradients follow the same diagonal k-space path. Interleaving top half-plane phase encodes with bottom half-plane (central ordering for example) provides full 2D translation motion information every TR using interpolation. Note, that the prewinders length is not changed compared to the traditional spin-warp prewinders. The name Butterfly comes from the shape of the k-space trajectory, FIG. 2b. Length 212 is a length where the odd trajectory rewinders overlap. The navigation data is the information used to measure movement. The optional navigation data may also be used to measure movement. The remaining data 216 may be used to generate an image. As can be seen, the navigation data may be much less than the remaining data 216.

Figure 3:
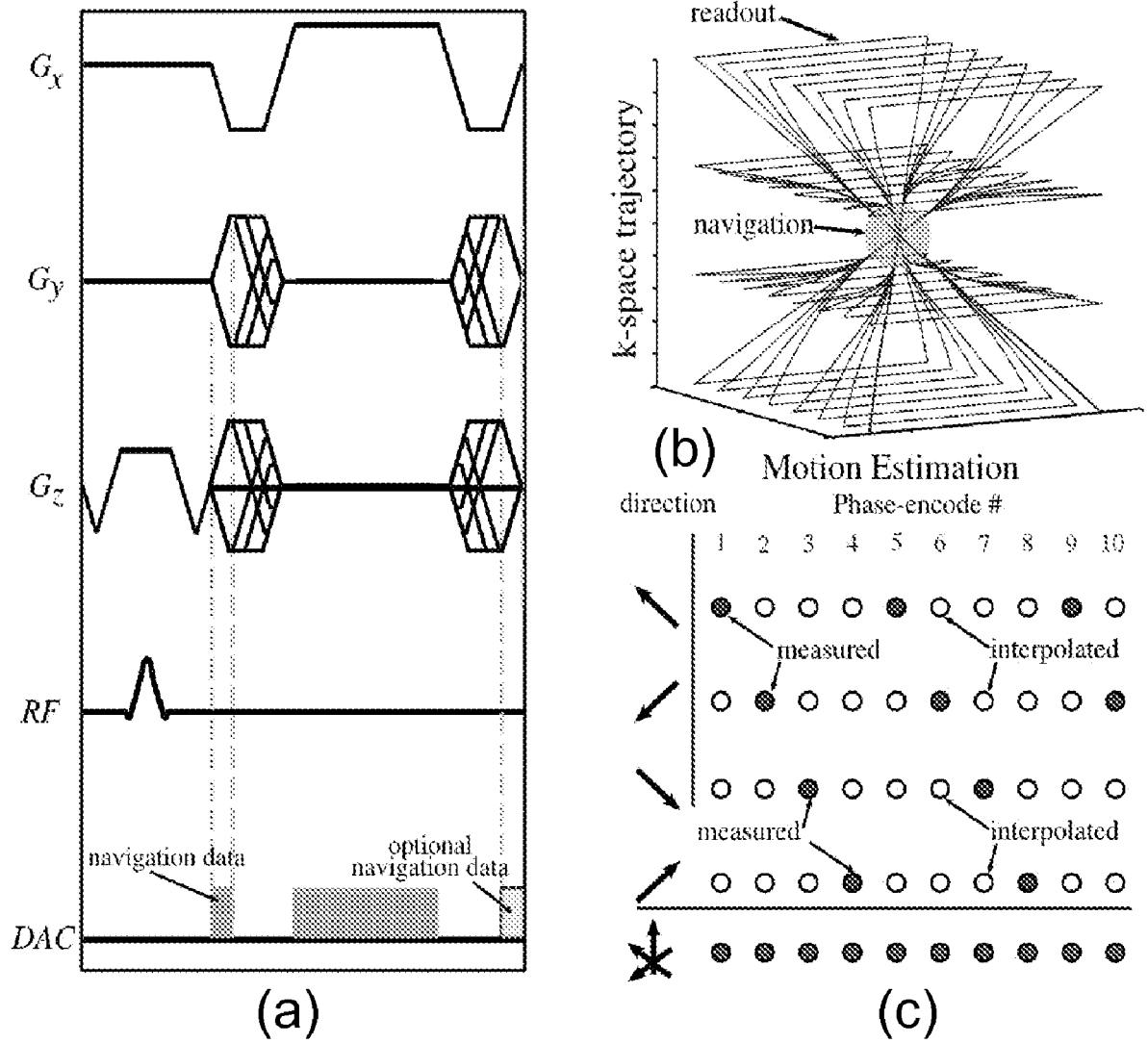
FIGS. 3a-c illustrate another example of the invention providing a 3D variant of the Butterfly pulse sequence.

FIGS. 3a-c illustrate another example of the invention providing a 3D variant of the Butterfly pulse sequence. For 3D, the slice encode gradient as well as the phase encodes are modified in a similar way as in the 2D case. For full translation information every TR it is necessary to interleave the phase-encode quadrants in the $k_y$-$k_z$ plane.

1.2 MOTION ESTIMATION

Arbitrary motion can be detected by comparing the phase and magnitude of the navigators. In the case of pure translation, the motion is measured by estimating the linear phase component.

Positive phase-encodes provide ID translation information in the top-left diagonal direction, while negative phase encodes measure translation in the bottom-left diagonal direction. To get a full 2D translation every TR the phase encode ordering is interleaved and the motion estimation is interpolated. In FIG. 2c an example using a centric k-space ordering is shown. For 3D, in order to get a full 3D translation measurement every TR, the 4 quadrants of k-space are interleaved. An example for 3D is given in FIG. 3c.

1.3 EXAMPLES

1.3.1 Phantom Experiment

To test an example of the invention, a phantom was scanned using a spoiled gradient recalled echo (SPGR) sequence and the Butterfly trajectory (2DFT, TR=30 ms, ReadOut=10 ms, Nav-time=0.24 ms, Flip=45, Res=300 µm, Slice=2 mm, NEX=1). The experiment was performed on a 1.5T GE Signa Excite scanner using a 3-inch surface coil attached to the phantom. The table was pushed in and out during the scan to simulate translation motion. In plane motion was estimated and the data was corrected accordingly. The result was compared to a non-corrected reconstruction.

Figure 4:
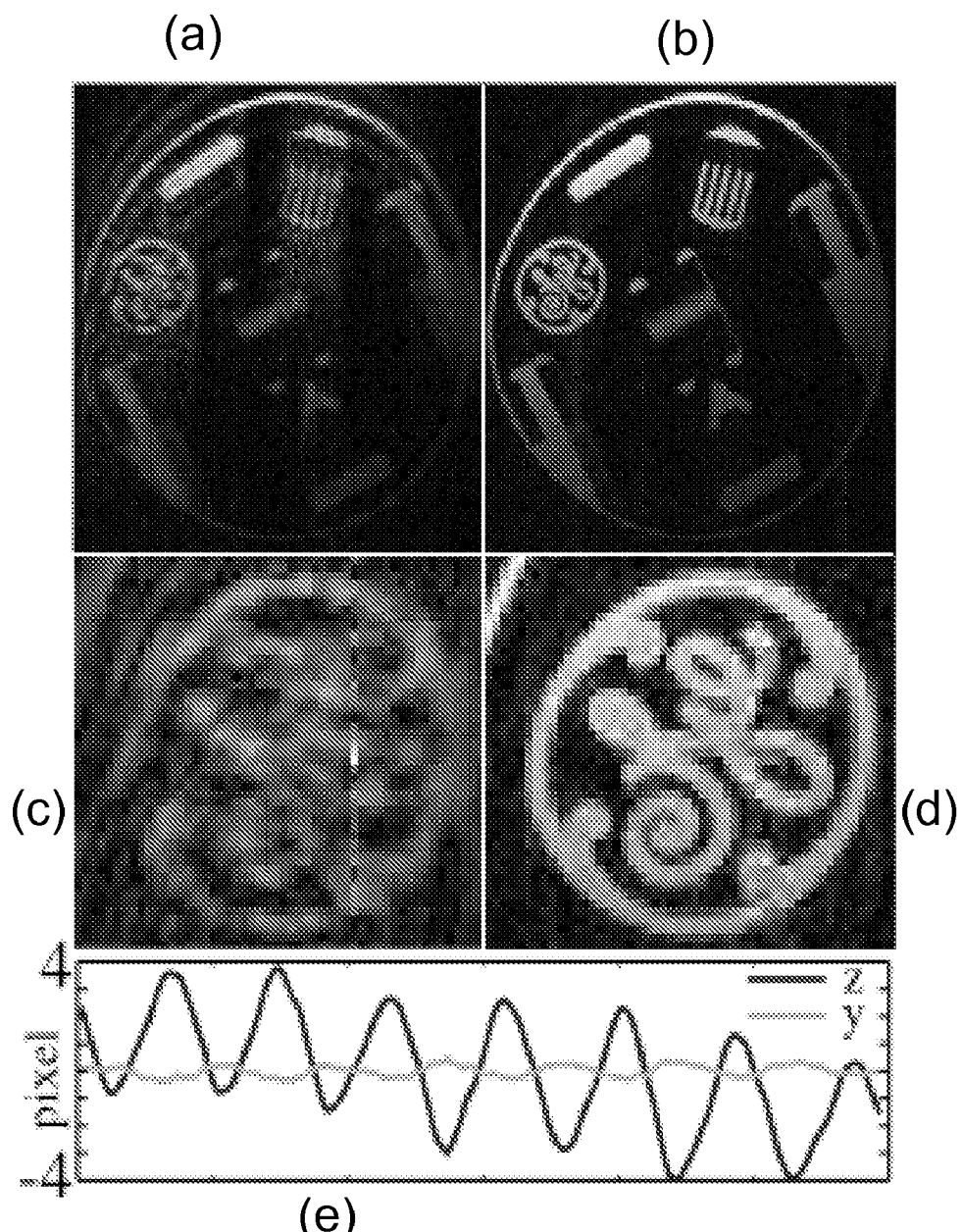
FIGS. 4a-e show the results of an experiment.

The results of the experiment are shown in FIGS. 4a-d. FIGS. 4a and c show images where motion was not corrected for. Using the measured motion the image is corrected, recovering high resolution features in the image, as shown in FIGS. 4b and d. FIG. 4e is a graph of the measured motion. Some geometric distortion is due to strong magnetic field inhomogeneity.

1.3.2 In-Vivo Experiment

To further test an example of the invention, a knee of a volunteer was scanned using an SPGR sequence and the Butterfly trajectory (2DFT, TR=30 ms, ReadOut=10 ms, Nav-time=0.24 ms, Flip=45, Res=300 µm, Slice=2 mm, NEX=4). The experiment was performed on a 1.5T GE Signa Excite scanner using a 3-inch surface coil attached to the knee. In one scan the volunteer was instructed to keep the knee as steady as possible and in a second scan was instructed to shake his knee during the scan. In plane motion was estimated for both scans and the data was corrected accordingly.

Figure 5:
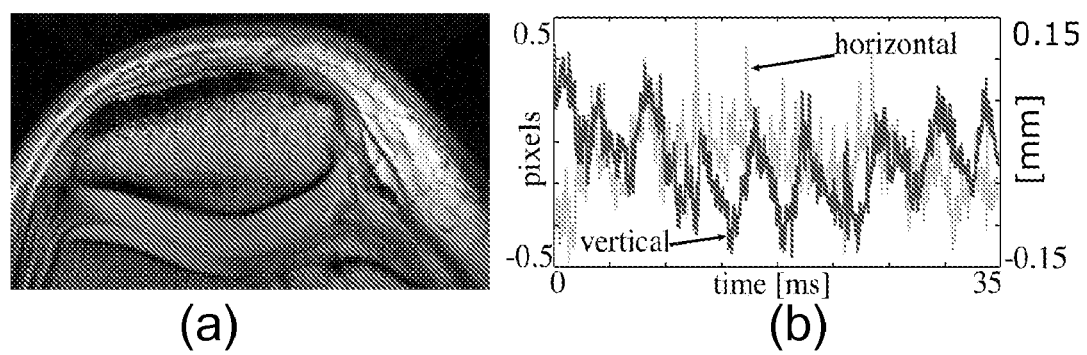
FIGS. 5a-b show the measured motion in the scan in which the volunteer was instructed to keep the knee steady.

FIGS. 5a-b show the measured motion in the scan in which the volunteer was instructed to keep the knee steady. A motion at the order of half a pixel magnitude (150 µm) was measured. The rate of change correlated to the breathing cycle of the subject.

Figure 6:
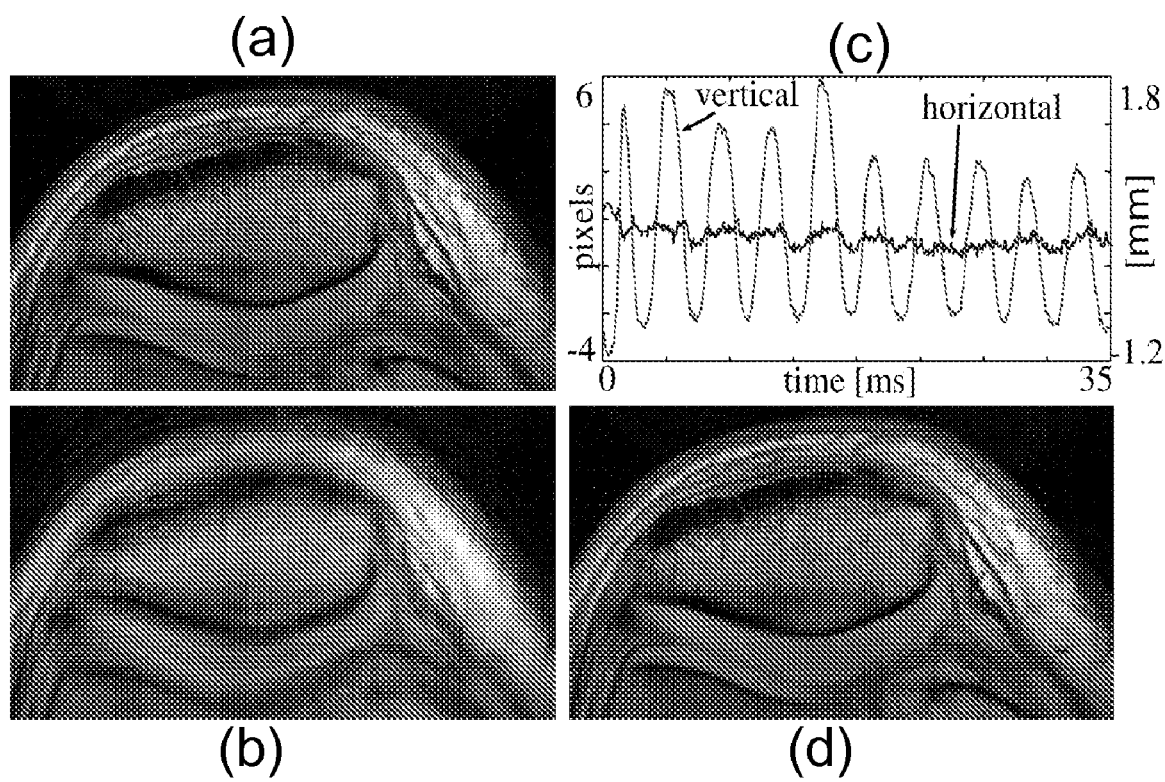
FIGS. 6a-d show the reconstruction results from the experiment in which the volunteer was instructed to shake his leg.

FIGS. 6a-d show the reconstruction results from the experiment in which the volunteer was instructed to shake his leg. FIG. 6a is an image generated when the volunteer made no intentional motion of the knee. FIG. 6b is an uncorrected image generated when the volunteer intentionally moved his knee. FIG. 6c is a graph of the motion measurements using an example of the invention. FIG. 6d is an image corrected for the measure motion. The quality of the corrected reconstruction is comparable to the one in which there was no intentional motion. This results show that even translation motion of the order of 10 pixels during the scan can be corrected successfully.

The prewinders and rewinders in the specification and claims are generally called winders. In an example of the invention, the different overlapping parts of the winders are orthogonal from each other and all passing through the origin. In other examples, the winders may not be orthogonal or they may not pass through an origin. In various examples either prewinders or rewinders or both may be used for navigation data to detect and optionally correct for motion. As a result, more generally the various examples use winders to detect and optionally correct for motion.

As shown in FIGS. 2a-c and 3a-c, various k-space scan planes of sets of readouts. An origin or winder intersection may be defined as the location where all of the winders and prewinders intersect in these examples. In these examples all prewinders in the same k-space scan plane on the same side of the winder intersection overlap for a length and all reminders in the same k-space scan plane on the same side of the winder intersection overlap for a length. In these examples, the overlapping length of the prewinders in the same k-space scan plane on one side of the winder intersection are orthogonal to the overlapping length of the prewinders in the same k-space scan plane on the other side of the winder intersection.

Figure 7:
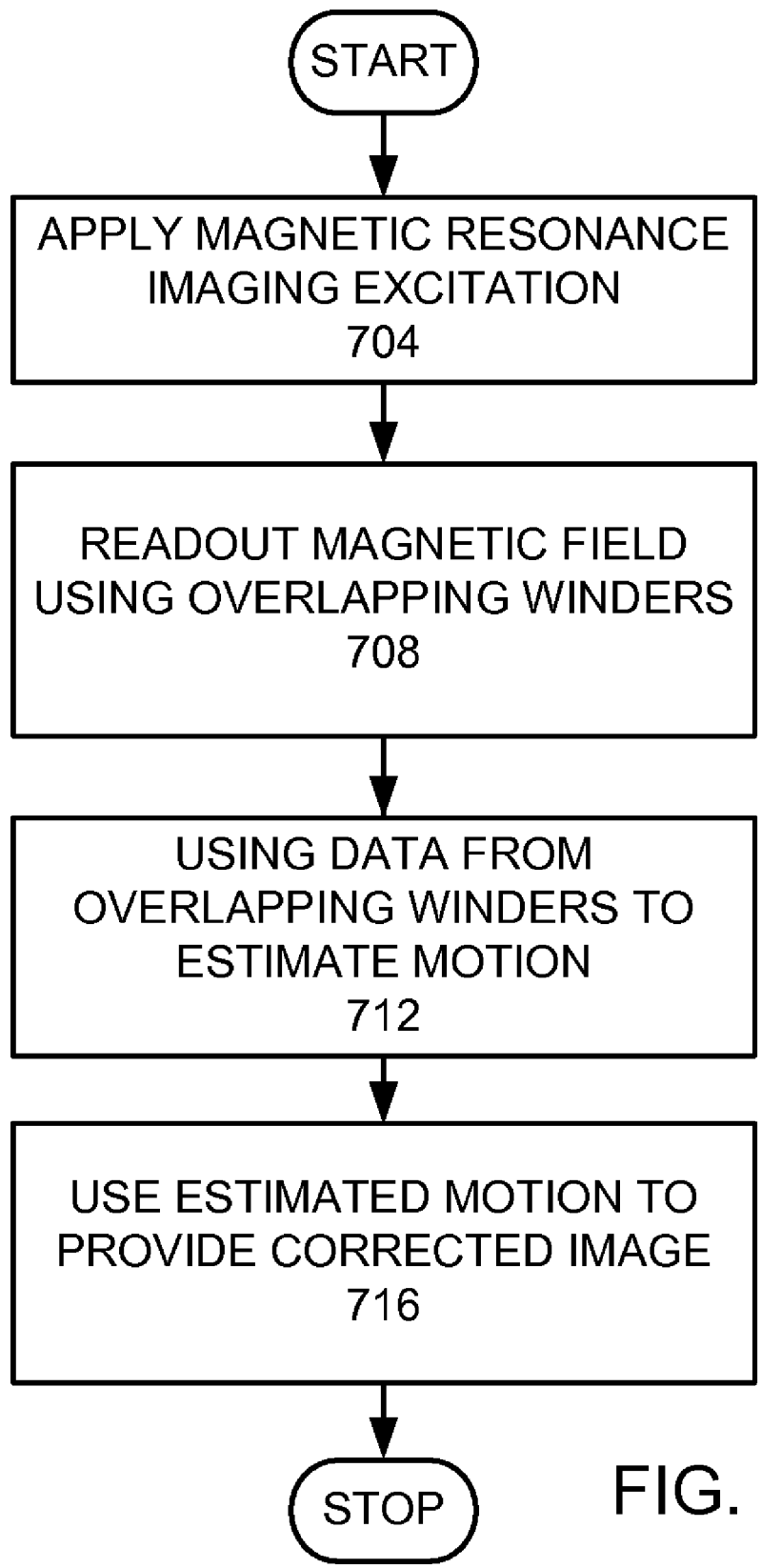
FIG. 7 is a high level flow chart of an embodiment of the invention.

FIG. 7 is a high level flow chart of an embodiment of the invention. A magnetic excitation is applied (step 704). A magnetic field readout is performed using overlapping winders (step 708). Overlapping winders means that a part of the winders overlap along a length. The readout data from the overlapping winders is used to estimate motion (step 712). The estimated motion is used to provide a corrected image (step 716). In this embodiment, data from nonoverlapping parts of the readout is used to construct the MRI image that is corrected using the estimated motion. In another embodiment, before a corrected image is provided, the estimated motion is used to determine whether to discard the readout data due to too much motion. In another embodiment, the image is not corrected, but the estimated motion is used to determine whether to discard the readout data due to too much motion.

Figure 8:
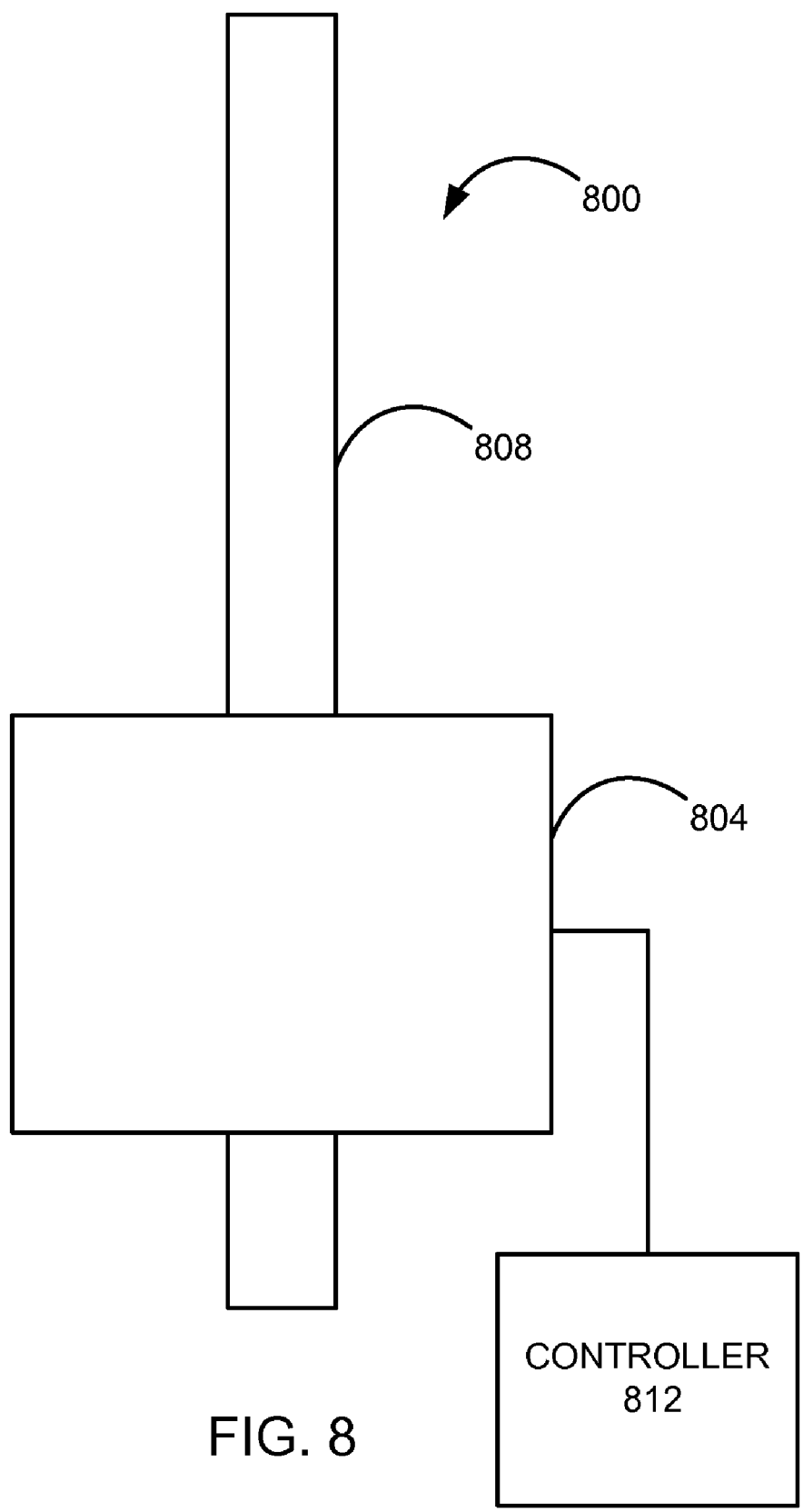
FIG. 8 is a schematic top view of a magnetic resonance imaging (MRI) system.

FIG. 8 is a schematic top view of a magnetic resonance imaging (MRI) system 800 that may be used in an embodiment of the invention. The MRI system 800 comprises a magnet system 804, a patient transport table 808 connected to the magnet system, and a controller 812 controllably connected to the magnet system. In one example, a patient would lie on the patient transport table 808 and the magnet system 804 would pass around the patient. The controller 812 would control magnetic fields and radio frequency (RF) signals provided by the magnet system 804 and would receive signals from detectors in the magnet system 804. The controller 812 could process the received signals to generate and display the resulting MRI image.

Figure 9A:
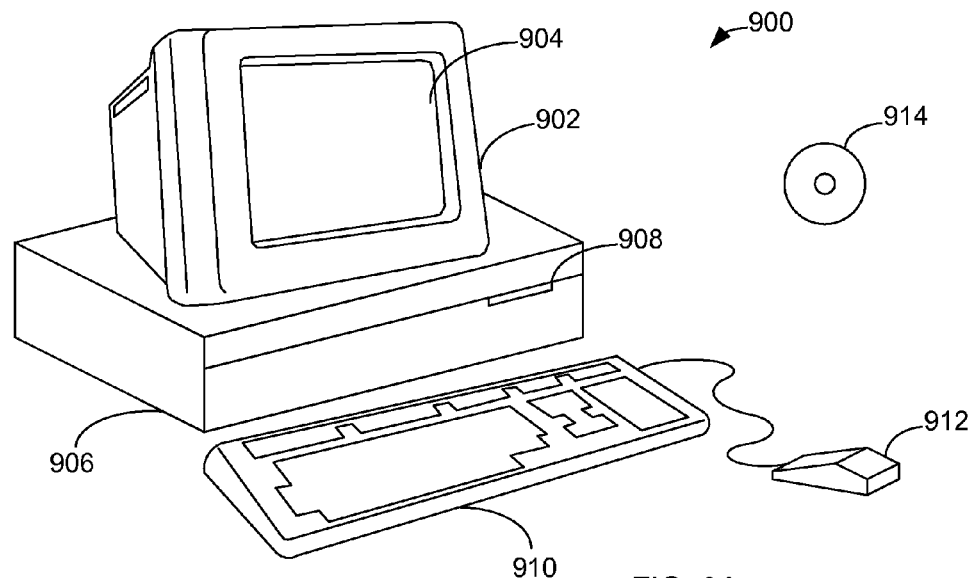
FIGS. 9A and 9B illustrate a computer system, which is suitable for implementing a controller used in embodiments of the present invention.
Figure 9B:
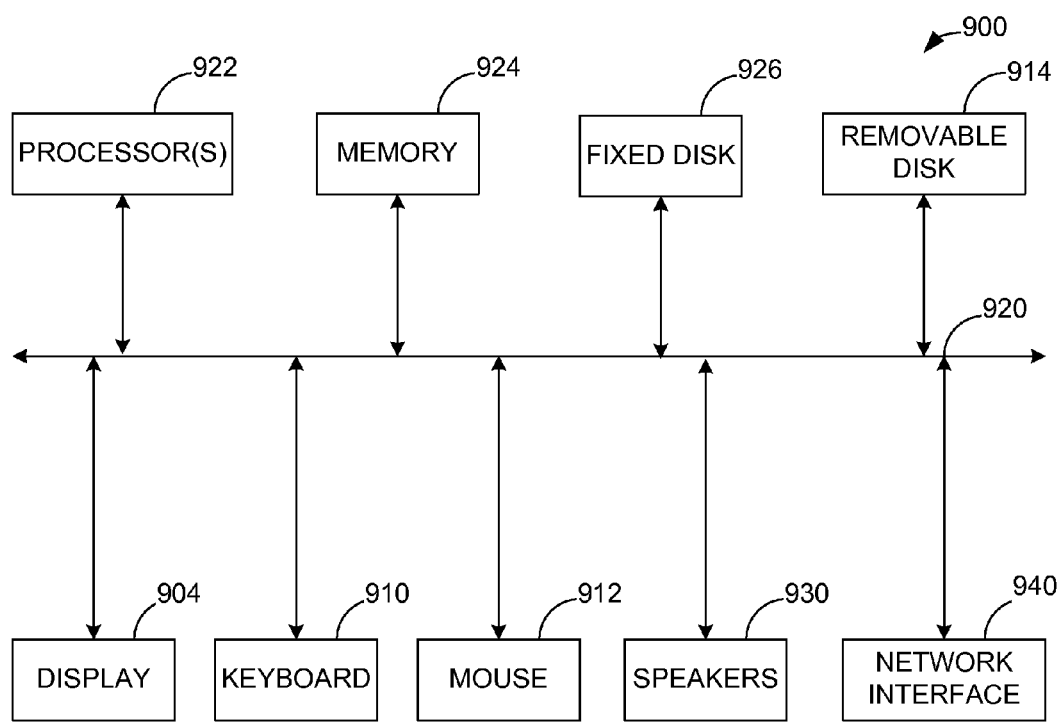

FIGS. 9A and 9B illustrate a computer system 900, which is suitable for implementing a controller 812 used in embodiments of the present invention. FIG. 9A shows one possible physical form of the computer system. Of course, the computer system may have many physical forms ranging from an integrated circuit, a printed circuit board, and a small handheld device up to a huge super computer. Computer system 900 includes a monitor 902, a display 904, a housing 906, a disk drive 908, a keyboard 910, and a mouse 912. Disk 914 is a computer-readable medium used to transfer data to and from computer system 900.

FIG. 9B is an example of a block diagram for computer system 900. Attached to system bus 920 are a wide variety of subsystems. Processor(s) 922 (also referred to as central processing units, or CPUs) are coupled to storage devices, including memory 924. Memory 924 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 926 is also coupled bi-directionally to CPU 922; it provides additional data storage capacity and may also include any of the computer-readable media described below. Fixed disk 926 may be used to store programs, data, and the like and is typically a secondary storage medium (such as a hard disk) that is slower than primary storage. It will be appreciated that the information retained within fixed disk 926 may, in appropriate cases, be incorporated in standard fashion as virtual memory in memory 924. Removable disk 914 may take the form of the computer-readable media described below.

CPU 922 is also coupled to a variety of input/output devices, such as display 904, keyboard 910, mouse 912, and speakers 930. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 922 optionally may be coupled to another computer or telecommunications network using network interface 940. With such a network interface, it is contemplated that the CPU might receive information from the network, or might output information to the network in the course of performing the above-described method steps. Furthermore, method embodiments of the present invention may execute solely upon CPU 922 or may execute over a network such as the Internet in conjunction with a remote CPU that shares a portion of the processing.

In addition, embodiments of the present invention further relate to computer storage products with a computer-readable medium that has computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

In an example of the invention, the MRI image is displayed on the display 904.

In the above examples, the ReadOut time was 10 ms and the Nav-time was 2.4 ms, so that the overlap of the winders was at least 20% of the ReadOut time. More generally, it is preferred that the overlap of the winders is at least 1% of the ReadOut time. Preferably, the winders overlap enough to provide at least 10 samples from the overlapping region for each of winders.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method for magnetic resonance imaging (MRI) of a patient implemented by a MRI system comprising a magnetic resonance imaging excitation and detection system and a controller, comprising the steps of:
   a) applying a magnetic resonance excitation through the magnetic resonance imaging and excitation detection system of the MRI system;
   b) reading out a magnetic field through k-space using pulse gradient winders, wherein some of the gradient winders overlap in k-space for a length of the winders through the magnetic resonance imaging and excitation detection system of the MRI system; and
   c) using readout data from overlapping lengths of pulse gradient winders to estimate motion of the patient implemented by the controller.

2. The method of claim 1, further comprising:
   determining if the estimated motion is beyond a threshold;

discarding the readout if the estimated motion is determined to be beyond the threshold; and constructing an MRI image if the estimated motion is determined to be less than the threshold and displaying the MRI image.

3. The method of claim 2, further comprising using the estimated motion to correct the MRI image.

4. The method of claim 3, wherein nonoverlapping portions of the readout are used to construct the MRI image.

5. The method of claim 1, further comprising constructing a MRI image using the read out of the magnetic field through k-space with the overlapping winders, where the estimated motion is used to correct the MRI image; and displaying the MRI image.

6. The method of claim 5, wherein nonoverlapping portions of the readout are used to construct the MRI image.

7. The method of claim 6, wherein all readouts in a common k-space scan plane and on the same side of winder intersection have portions winders that overlap along a length and portions of winders that do not overlap along a length.

8. The method of claim 7, wherein each readout has a first winder and a second winder, wherein the first winder is a prewinder and the second winder is a rewinder.

9. The method of claim 8, wherein the prewinders for readouts in a common scan plane on one side of a winder intersection overlap for a length and the prewinders for readouts in the common scan plane on another side of the winder intersection overlap for a length that is orthogonal to the length that the prewinders overlap on the one side of the winder intersection.

10. The method, as recited in claim 9, wherein the reading out the magnetic field uses a two dimensional discrete Fourier Transform (2DFT) acquisition.

11. The method, as recited in claim 10, wherein only readout data from overlapping lengths of winders is used to estimate motion.

12. The method of claim 1, wherein all readouts in a common k-space scan plane and on the same side of winder intersection have portions winders that overlap along a length and portions of winders that do not overlap along a length.

13. The method of claim 1, wherein each readout has a first winder and a second winder, wherein the first winder is a prewinder and the second winder is a rewinder, wherein the prewinders for readouts in a common scan plane on one side of a winder intersection overlap for a length and the prewinders for readouts in the common scan plane on another side of the winder intersection overlap for a length that is orthogonal to the length that the prewinders overlap on the one side of the winder intersection.

14. The method, as recited in claim 1, wherein the reading out the magnetic field uses a two dimensional discrete Fourier transform (2DFT) acquisition.

15. The method, as recited in claim 1, wherein only readout data from overlapping lengths of winders is used to estimate motion.

16. A method for magnetic resonance imaging (MRI) of a patient implemented by a MRI system comprising a magnetic resonance imaging excitation and detection system and a controller, comprising the steps of:

a) applying a magnetic resonance excitation through the magnetic resonance imaging and excitation detection system of the MRI system;

b) reading out a magnetic field through k-space using pulse gradient winders with a two dimensional discrete Fourier transform (2DFT), wherein some of the pulse gradient winders have a common initial trajectory for a length of the pulse gradient winders in k-space, through the magnetic resonance imaging and excitation detection system of the MRI system; and c) using readout data only from the common initial trajectory of pulse gradient winders to estimate motion of the patient implemented by the controller.

17. A magnetic resonance imaging apparatus for providing a magnetic resonance image of a patient, comprising:

a magnetic resonance imaging excitation and detection system; and a controller electrically connected to the magnetic resonance imaging excitation and detection system, comprising:

a display;

at least one processor; and computer readable media, comprising:

computer readable code for applying a magnetic resonance excitation;

computer readable code for reading out a magnetic field through k-space using pulse gradient winders, wherein some of the pulse gradient winders overlap in k-space for a length of the pulse gradient winders; and computer readable code for using readout data from overlapping lengths of pulse gradient winders to estimate motion of the patient.

18. The apparatus, as recited in claim 17, further comprising:

computer readable code for constructing a MRI image using the read out of the magnetic field through k-space with the overlapping winders, where the estimated motion is used to correct the MRI image; and computer readable code for displaying the MRI image on the display.

19. The apparatus, as recited in claim 18, wherein the computer readable code for reading out a magnetic field through k-space using winders comprises computer readable code for performing a two dimensional discrete Fourier transform acquisition.

* * * * *